June 9, 1959 M. CHODOROW 2,890,373

RETARDED WAVE ELECTRON DISCHARGE DEVICE

Filed May 12, 1955

MARVIN CHODOROW
INVENTOR

BY

ATTORNEY

United States Patent Office 2,890,373

Patented June 9, 1959

2,890,373

RETARDED WAVE ELECTRON DISCHARGE DEVICE

Marvin Chodorow, Menlo Park, Calif., assignor to Varian Associates, San Carlos, Calif., a corporation of California Application May 12, 1955, Serial No. 507,913

3 Claims. (Cl. 315—3.6)

Figure 1:
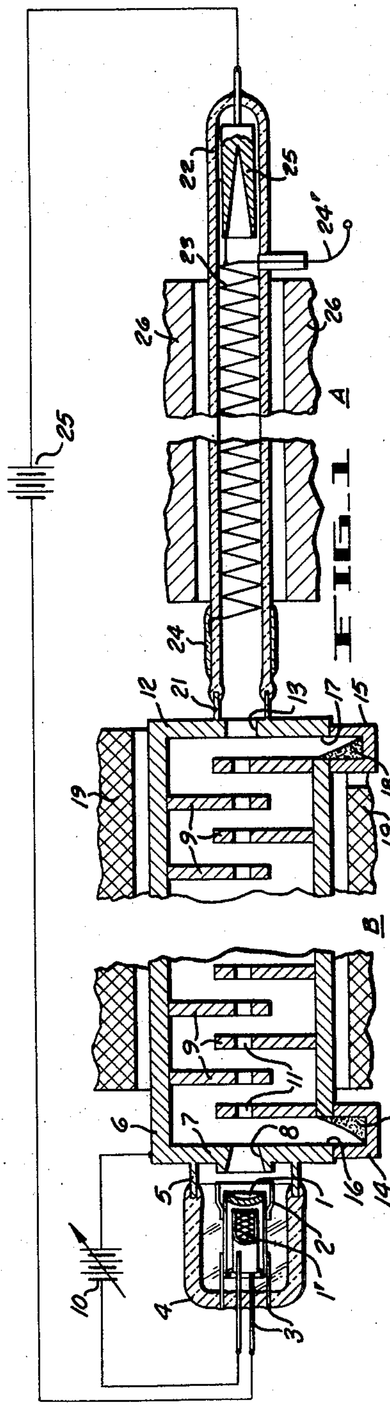

This invention relates in general to electron discharge devices of the retarded wave type and, more particularly, to a novel electron discharge device which incorporates the advantages of a backward wave oscillator and a traveling wave tube amplifier, the two stages resembling these particular structures being coupled in tandem, a common electron beam passing successively through the oscillator and amplifier stages.

Retarded wave devices, those in which a traveling electromagnetic wave is retarded in its passage through the device so that it proceeds longitudinally through the device at a velocity equal to the velocity of an electron beam traveling through the device and coupled to the traveling wave, are in common use. In a traveling wave tube amplifier, the forward traveling wave introduced into the input end of the device interacts with the electron beam in such manner that the wave absorbs energy from the beam during this synchronous passage and passes from the device in a greatly amplified state. The beam of electrons is bunched, or velocity modulated, due to the interaction of the beam and traveling wave and is dissipated at the collector end of the device. In addition to the forward traveling wave amplifiers, there exists retarded wave devices in which backward traveling harmonic waves may be brought into step with the bunched beam and absorb energy therefrom. That is, the phase velocity of the electromagnetic wave travels in the opposite direction to the beam. The resultant effect is self-sustained oscillation, such a device being termed a backward wave oscillator. The most important and useful feature of these retarded wave devices is their large bandwidths.

The purpose of this present invention is to provide a novel electron discharge device which comprises a first stage resembling a backward wave oscillator and a second stage resembling a traveling wave amplifier, the oscillator section and amplifier section being traversed by a single electron beam. The beam of electrons is velocity modulated in its passage through the backward wave oscillator section, the beam passing from this stage in a bunched state. The modulated beam then passes into the traveling wave amplifier stage where an electromagnetic wave is initiated on the retarding wave structure by the beam and then greatly amplified during its longitudinal passage through the amplifier, the amplified signal passing from the tandem device at the output end of the traveling wave amplifier stage. This tandem device has the advantage which such retarded wave devices possess, that is, the wide band electronic tunability. A further advantage of this tandem device is that the efficiency of this high-frequency tandem oscillator is greater than the efficiency of a normal backward wave oscillator device since the efficiency of the second or traveling wave amplifier stage is better than that of a backward wave oscillator. The efficiency of this device would approach that of the conventional traveling wave tube. This single tandem device may be utilized to good advantage as a combined oscillator and buffer amplifier, preventing the load circuits beyond the amplifier from pulling the oscillator.

It is, therefore, the object of the present invention to provide a combined retarded-wave oscillator and amplifier type structure coupled in tandem and traversed by a common electron beam, the amplifier stage serving to amplify the radio frequency signal initiated in the oscillator stage, the tandem device being operable over a wide band width responsive to electronic tuning.

One feature of the present invention is the provision of a novel retarded wave discharge device in which a backward wave oscillator structure forms the first stage thereof and a traveling wave tube amplifier structure forms the second stage, the stages being coupled in tandem and having a common electron beam traversing the two stages.

Another feature of the present invention is the provision of a novel discharge device of the above type in which the backward wave oscillator stage includes a folded wave guide type of retarded wave structure.

A further feature of the present invention is the provision of a means for electrically tuning this tandem frequency generator device.

Still another feature of the present invention is the provision of an attenuating stage between the oscillator and amplifier stages of this tandem device.

Figure 2:
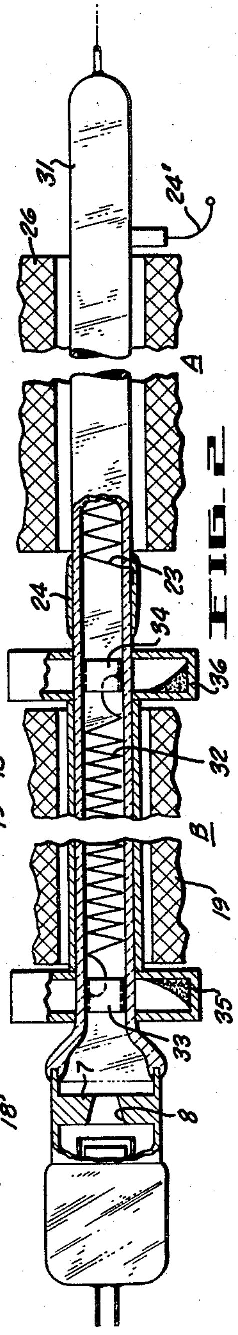
Figure 3:
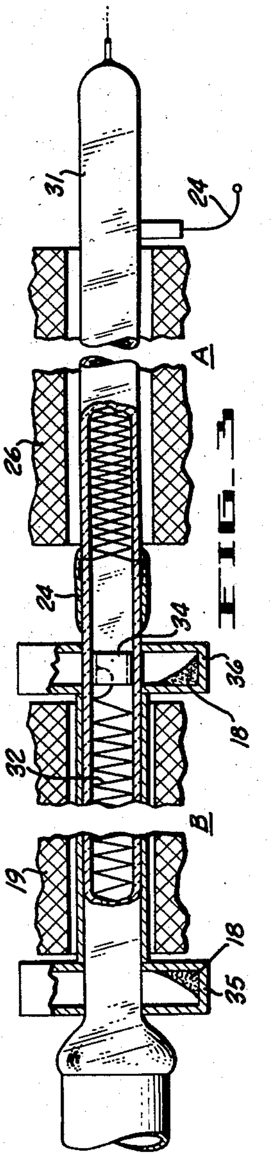

These and other features and advantages of this invention will become apparent from a perusal of the following specification taken in connection with the accompanying drawings wherein, Fig. 1 is a longitudinal section view of one embodiment of this novel tandem device utilizing a folded waveguide type of backward wave oscillator structure coupled to a helix type of traveling wave tube amplifier structure by means of a common electron beam, Fig. 2 is a longitudinal section view of another embodiment of the present invention in which both the backward wave oscillator stage and the subsequent traveling wave tube amplifier stage employ the helix type of retarded wave structure, and Fig. 3 is a fragmentary side elevation view partly in longitudinal section of still another embodiment of the present invention wherein the traveling wave tube amplifier stage employs a contra-wound helix type of retarded wave structure.

Similar reference numerals are used in the above figures to designate corresponding elements.

Referring now to Fig. 1, there is shown a structure consisting of a portion B which resembles a backward wave oscillator and a portion A resembling a traveling wave amplifier coupled in tandem with portion B. A common electron beam is produced by a cathode assembly comprising the electron emissive cathode button 1, heater filament 1', and an annular beam-focusing ring 2. This cathode structure is mounted on suitable mounting leads 3 which are vacuum sealed in a glass vacuum envelope 4. The glass envelope 4 is secured in vacuum sealed relation to an annular-shaped lip 5 extending from one end of the backward wave oscillator body 6. This body 6 is a hollow, elongated member of suitable conducting material having a substantially square cross-sectional configuration. The cathode end 7 of the body has a centrally positioned truncated opening 8 therein aligned with the cathode assembly. This end 7 has a positive potential thereon supplied from the source of potential 10 and serves as an anode electrode to draw the beam from the cathode at a high velocity through the opening 8. Secured to the inner walls of the body 6 and extending in an interlaced manner within the body are interdigital members 9. These members 9 are rectangular in shape, being secured at one end to the inside wall surface of body 6, and have circular openings 11 located near their inner ends. The members 9 are so positioned that the openings 11 are axially aligned within the body 6 in alignment with the opening 8 and the cathode assembly. The other end of the body 12 has a centrally positioned circular opening 13 therein aligned with the openings 11 in the interdigital members 9. Short wave guide stubs 14 and 15 are securely affixed, as by brazing, over openings 16 and 17 located in each end of the body 6. A loading material 18 is positioned in each of the waveguide stubs 14 and 15. Encircling the body 7 is a beam focusing magnetic device 19.

Extending from the other end 12 of the body 6 is an annular mounting lip 21 to which is vacuum sealed a hollow elongated body 22 of suitable insulation material such as glass. Positioned coaxially within the body is a wire helix 23, one end of which extends through the vacuum sealed body 22 into contact with a lossy material 24, such as aquadag, encircling the body 22 and forming an attenuating section between the oscillator stage B and amplifier stage A. The other end 24′ of the helix 23 extends without the vacuum envelope 22 and forms an output antenna. A collector electrode 25 is positioned in the outer end of the envelope 22, the collector being coupled to a source 25′ of positive potential. A beam focusing magnet structure 26 encircles the envelope 22.

In operation, the stream of electrons emitted from the cathode button 1 are focused into a beam by the focusing ring 2 and accelerated through the opening 8 due to the positive potential on body 6. The beam proceeds axially through the interdigital structure, passing through the openings 11 in the successively positioned interdigital members 9. The magnet device 19 produces a strong magnetic field which maintains the beam focused through the device. The inner walls of the body 6 and the surfaces of the interdigital members 9 form a sinuous or folded waveguide path over which electromagnetic waves will travel. The passage of the electron beam axially through the openings 11 in the structure 6 initiates an electromagnetic wave in the folded waveguide path and, by suitably selecting the length of the retarded wave structure and adjusting the beam velocity in accordance with well-known backward wave oscillator practices, the beam is made to interact with a component of the electromagnetic wave traveling in a backwards direction, that is, from right to left in the member 6 as shown in Fig. 1, in such manner to produce self-oscillation within the device. In standard backward wave oscillation practice, the radio frequency energy output is removed from the backward wave oscillator near the input end of the device, the output corresponding in this particular instance to the waveguide stud 14. However, in the novel device of this invention, this radio frequency energy is absorbed in the load 18 located in the waveguide stub 14. The lossy material in the waveguide stub 15 prevents reflections from being set up in the device.

As the electron beam interacts with the electromagnetic traveling wave, the electron beam is velocity modulated, the beam leaving the backward wave oscillator device 6 through opening 13 in a velocity modulated condition, i.e., bunched. The bunched beam travels axially through the helix 23 and finally impinges on the collector electrode 25 where the electrons are collected. At the entrance end of the helix, the bunched electron beam initiates an electromagnetic wave on the helix structure 23, this wave traveling along the helix 23 and interacting with the velocity modulated beam to absorb energy therefrom. This electromagnetic wave produced on the helix is of the same radio frequency as the radio frequency signal developed in the backward wave oscillator stage. The electromagnetic wave, as it travels from the left hand end of the helix structure to the right hand end as seen in Fig. 1, increases in amplitude and passes from the structure over the antenna lead 24′ in a greatly amplified state. The electron beam is maintained in a focused condition during its passage through the traveling wave tube stage A by the magnet structure 26 encircling the envelope 22.

The radio frequency of the oscillator section may be varied by varying the potential applied to the oscillator stage by variable source 10, this potential variation in turn varying the beam velocity. In this manner, the oscillator frequency and the resultant amplified radio frequency radiated over lead 24 may be varied over an extremely wide band width.

Referring to Fig. 2, there is shown another embodiment of the novel tandem device of the present invention. In this particular embodiment both the backward wave oscillator stage B and the traveling wave tube amplifier stage A utilize helix type retarded wave structures.

The electron beam produced by the cathode assembly is accelerated through the opening 8 in the anode member 7, this anode member being vacuum sealed to a long hollow vacuum envelope 31 of suitable material such as glass. The helix 32 in the backward wave oscillator stage is terminated in suitable coupling members 33 and 34 at either end thereof, there being waveguide terminations 35 and 36 coupled to the coupling members 33 and 34 at the two respective ends of the backward wave oscillator stage. The amplifier stage A is constructed similarly to the amplifier stage shown in Fig. 1. This tandem device operates in much the same manner as that shown in Fig. 1, the backward wave oscillator stage velocity modulating the electron beam which is then transmitted through the traveling wave amplifier stage where it initiates a traveling electromagnetic wave on the helix and gives up energy to the electromagnetic wave.

The tandem device shown in Fig. 1 is preferable in one respect to that of Fig. 2 in that the electron beam emerging from an interdigital type of retarded wave structure in a backward wave oscillator has a distribution of current which is more suitable for exciting electromagnetic waves on the helix in the amplifier stage than the beam which emerges from a helix type structure. The distribution of current in the beam of Fig. 1 is a relatively uniform distribution over the cross-sectional area of the beam whereas the beam in Fig. 2 has a current distribution which is appreciably greater at the outer portion of the cross-sectional area than in the center. The optimum interaction between beam and retarded wave structure in the traveling wave tube amplifier stage occurs when the current distribution is most uniform.

Referring to Fig. 3, there is shown still another embodiment of the present invention. This particular embodiment employs a single-helix type retarded wave structure in the backward wave oscillator stage B and a contro-wound helix type structure in the amplifier stage. The advantages of utilizing a contra-wound helix structure in a traveling wave tube amplifier is set forth in a pending patent application of the present inventor, Serial No. 385,357, filed October 12, 1953, now U.S. Patent No. 2,836,758, entitled "Electron Discharge Device." The contra-wound structure eliminates the possibility of the traveling wave tube amplifier ever reaching the critical point where it could break out into self-oscillation due to interaction of the beam with an electromagnetic wave traveling backwards along the retarded wave structure.

Since many changes may be made in the above construction of the novel tandem electron discharge device this invention and many apparent widely different embodiments could be made without departing from the scope hereof, it is intended that all matter contained in the above description or shown in the accompanying drawings shall be interpreted as illustrative and not in a limiting manner.

What is claimed is:

1. An electron discharge device having a wide operating bandwidth comprising, a cathode adapted to produce an electron beam traversing the device, an initial backward wave stage having interdigital members for coacting with the electron beam and operating as an oscillator for velocity modulating the electron beam, said backward wave stage having waveguide stubs at its ends containing loading material, a subsequent traveling wave amplifier stage for interaction with the velocity modulated electron beam whereby electromagnetic wave energy is initiated and amplified in said amplifier stage, means between said stages for preventing feedback, and means for extracting amplified wave energy from said amplifier stage.

2. An electron discharge device having a wide operating bandwidth comprising, a cathode adapted to produce an electron beam traversing the device, an initial backward wave stage having interdigital members for coacting with the electron beam and operating as an oscillator for velocity modulating the electron beam, a subsequent traveling wave amplifier stage for interaction with the velocity modulated electron beam whereby electromagnetic wave energy is initiated and amplified in said amplifier stage, means preventing feedback between said stages, and means for extracting the amplified wave energy from said amplifier stage, said feedback preventing means comprising a lossy material positioned between the backward wave oscillator stage and the traveling wave amplifier stage.

3. In combination with the electron discharge device claimed in claim 2, means for applying a variable accelerating voltage to said backward wave oscillator stage to change the operating frequency thereof and of the output of said traveling wave amplifier stage.

References Cited in the file of this patent

UNITED STATES PATENTS

| | | |
|---|---|---|
| 2,702,370 | Lerbs | Feb. 15, 1955 |
| 2,712,614 | Field | July 5, 1955 |
| 2,753,481 | Ettenberg | July 3, 1956 |
| 2,800,604 | Beaver | July 23, 1957 |
| 2,824,256 | Pierce et al. | Feb. 18, 1958 |

FOREIGN PATENTS

| | | |
|---|---|---|
| 699,893 | Great Britain | Nov. 18, 1953 |
| 1,080,207 | France | May 26, 1954 |